(12) United States Patent
Selway et al.

(10) Patent No.: US 6,983,429 B2
(45) Date of Patent: Jan. 3, 2006

(54) FORMAL PROOF METHODS FOR ANALYZING CIRCUIT LOADING PROBLEMS UNDER OPERATING CONDITIONS

(75) Inventors: David W. Selway, Phoenix, AZ (US); Boubaker Shaiek, Phoenix, AZ (US)

(73) Assignee: Bull HN Information Systems Inc., Billerica, MA (US)

( * ) Notice: Subject to any disclaimer, the term of this patent is extended or adjusted under 35 U.S.C. 154(b) by 293 days.

(21) Appl. No.: 10/675,851

(22) Filed: Sep. 30, 2003

(65) Prior Publication Data

US 2005/0071793 A1    Mar. 31, 2005

(51) Int. Cl.
G06F 17/50    (2006.01)
(52) U.S. Cl. .................... 716/1; 716/2; 716/6; 716/17; 716/18
(58) Field of Classification Search .................... 716/1, 716/2, 6, 16, 17, 18
See application file for complete search history.

(56) References Cited

U.S. PATENT DOCUMENTS 6,886,152 B1 * 4/2005 Kong .......................... 716/16

* cited by examiner

Primary Examiner—Thuan Do
(74) Attorney, Agent, or Firm—James H. Phillips; Russell W. Guenthner

(57) ABSTRACT

A process for determining the optimum load driving capacity for each driving node in a complex logic circuit is disclosed. First, the logic equations of the logic circuit are extracted from a circuit description. Then, the fan-out of each driving node is analyzed to determine if the total number of pass transistor loads of the analyzed node is excessive compared to a predetermined driving capacity. For each flagged node, logic equations are added which represent the sum of the node's pass transistor loads, and further logic equations are added to compare the number of pass transistors turned on from one to the absolute maximum for the node. Then, a formal proof program is used to analyze the logic circuit and determine which of the comparators have a true output. For each flagged node, the comparator for the largest number which has a possible true output is identified to determine the highest possible actual load for the node; and, if necessary, the driving capacity of the node is adjusted to handle the determined highest possible actual load.

2 Claims, 4 Drawing Sheets

FORMAL PROOF METHODS FOR ANALYZING CIRCUIT LOADING PROBLEMS UNDER OPERATING CONDITIONS

FIELD OF THE INVENTION

This invention relates to the art of logic design and implementation and, more particularly, to a tool for determining if any driving node in a very complex logic circuit, such as a processor, has suitable power handling capacity to drive its collective loads under "real", rather than "worst-case" assumed, conditions.

BACKGROUND OF THE INVENTION

Modern integrated circuits have become very dense and complex. For example, state-of-the art integrated circuits constituting processors may each include many millions of transistors and other components. There are software logic equation generation and analysis tools for extracting logic equations from a circuit description and providing certain preliminary analysis. This is a routine procedure carried out early in the logic design of a complex digital system component. However, checking the resulting logic equations of, for example, a processor for subtle errors is a very formidable problem which is impossible to carry out manually and difficult to achieve with any test software.

It might be thought that all possible errors could be found by exercising exhaustive combinations of inputs, outputs and operations sequentially, with test software, on the logic equations representing the design, but, even with a high speed test program running on a powerful machine, the time required is prohibitive and adequate coverage cannot be achieved. As a result, a class of advanced logic analysis programs have been developed which first examine the logic equations and reduce them before analyzing all possible combinations in a search for possible design errors. The processes of these advanced analysis programs are variously known as formal proof, equivalence proof, equivalence checking, formal verification, formal validation, property checking, etc. (For convenience, the term "formal proof" is used herein as a generic term for these types of programs.) While formal proof programs may still take a long time to analyze all combinations of the reduced logic, the time is not prohibitive for use during the development and analysis of a complex logic component.

In the preliminary analysis phase of logic circuits by logic equation generation and analysis programs, violations of "loading" and "drive" restrictions for driving nodes and other similar analyses are made. These analyses are typically based upon absolute worst-case assumptions which is necessary because the program doing the analysis typically does not "know" the logic states or have a list of the legal conditions which might control or restrict the operation of the logic circuit under "real" conditions. These absolute "worst case" assumptions involve no analysis of the logical state of a circuit and simply look for violations of loading rules while making the assumption that all possible loads are "actively loading" a specific driving circuit at all times. But, this absolute worst-case assumed solution may be much too pessimistic in that, in all "real" possible combinations for a given driving node, some of the loads may be through transistors which are not enabled such that the actual worst case loading might be less or even much less. This characteristic leads to warnings or error reports, from circuit analysis programs, which are in fact not "real" or possible during the actual operation of the logic circuit. The logic even of a single driving node may be too complicated to analyze easily by hand, and/or the number of warnings/errors reported may obscure the recognition of "real" errors; i.e., the important message may be buried in a report containing a large number of "false" errors.

While the absolute worst-case assumed solution provides a safely operable power handling capability for a given driving node, significant disadvantages are that when the design is implemented in hardware, more "real estate" area on the complex logic circuit's actual integrated circuit(s) and the resulting false need for a larger driving transistor slows down the actual operation of the circuit.

Thus, it will be appreciated by those skilled in the art of logical design of complex digital circuits that it wold be highly desirable to provide an efficient way to analyze the largest real loading of each and every driving node and to use that information to more correctly report upon violations in the power requirements for the driving transistor and to aid in properly sizing the transistors. This proper sizing may result in a circuit of less area and higher speed.

OBJECTS OF THE INVENTION

It is therefore a broad object of this invention to provide a method for determining the worst case "real" loading of a driving node in a complex logic circuit under "active" or "real" conditions.

It is a more specific object of this invention to provide a method which adds logic for mathematical analysis by a formal proof program to analyze the entire complex logic circuit and then uses the results to identify loading violations which exist only under conditions which are logically possible.

SUMMARY OF THE INVENTION

Briefly, these and other objects of the invention are achieved by a process for determining the optimum load driving capacity for each driving node in a complex logic circuit. First, the logic equations of the logic circuit are extracted from an electronic circuit description. Then, the fan-out of each driving node is analyzed to determine if the total number of pass transistor loads of the analyzed node is excessive compared to a predetermined driving capacity. For each flagged driving node, logic equations are added which represent the sum of the driving node's pass transistor loads, and further logic equations are added to compare the number of pass transistors turned on from one to the absolute maximum for the flagged driving node. Then, a formal proof program is used to analyze the logic circuit and determine which of the comparators have a true output. For each flagged node, the comparator for the largest number which has a possible true output is identified to determine the highest possible actual load for the flagged driving node; and, if necessary, the driving capacity of the node is adjusted to handle the determined highest possible actual load.

DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the subjoined claims and the accompanying drawing of which:

DESCRIPTION OF THE PREFERRED EMBODIMENT(s)

Figure 1:
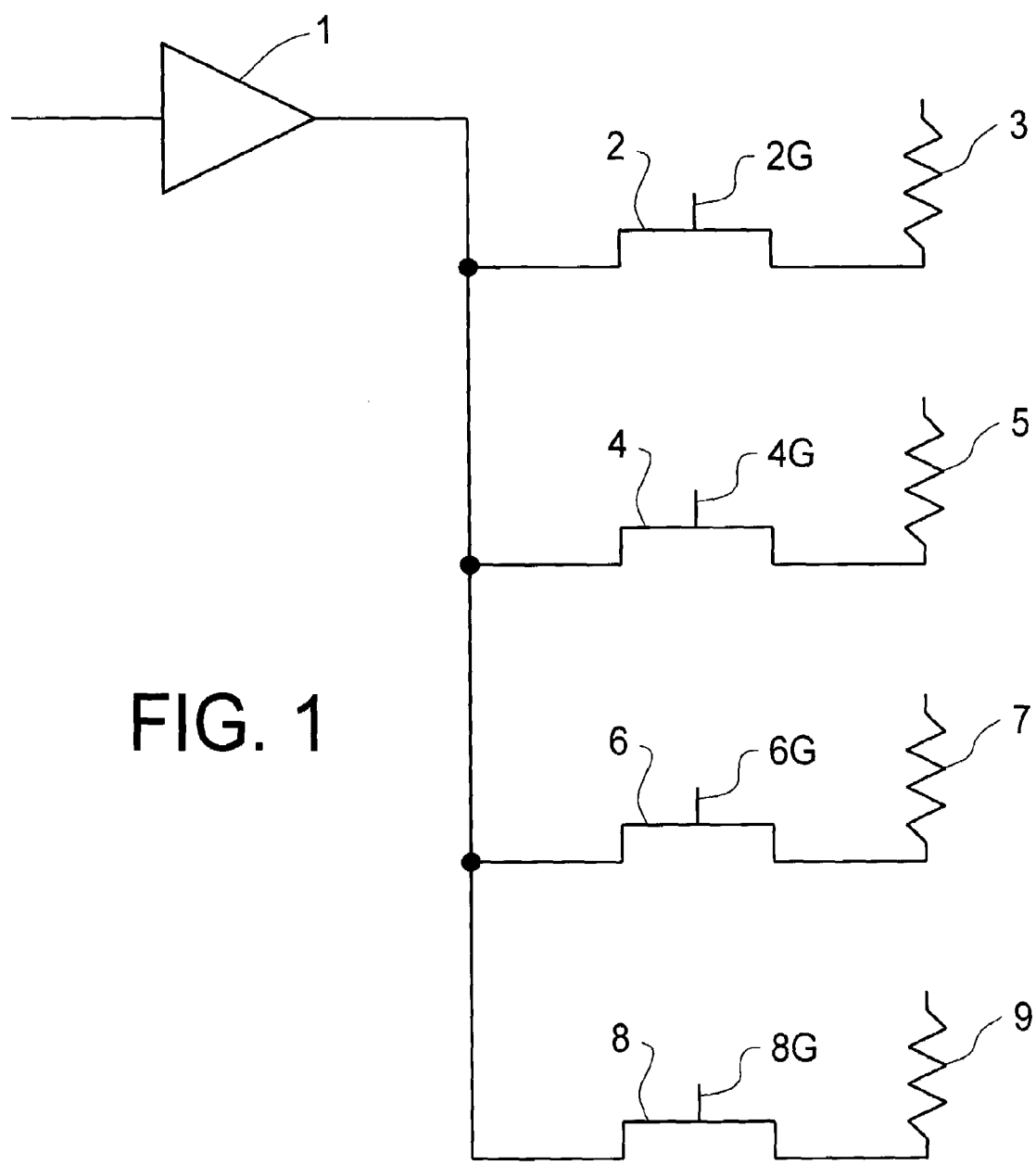
FIG. 1 is a logic diagram of a typical driving node of a first exemplary type.
Figure 2:
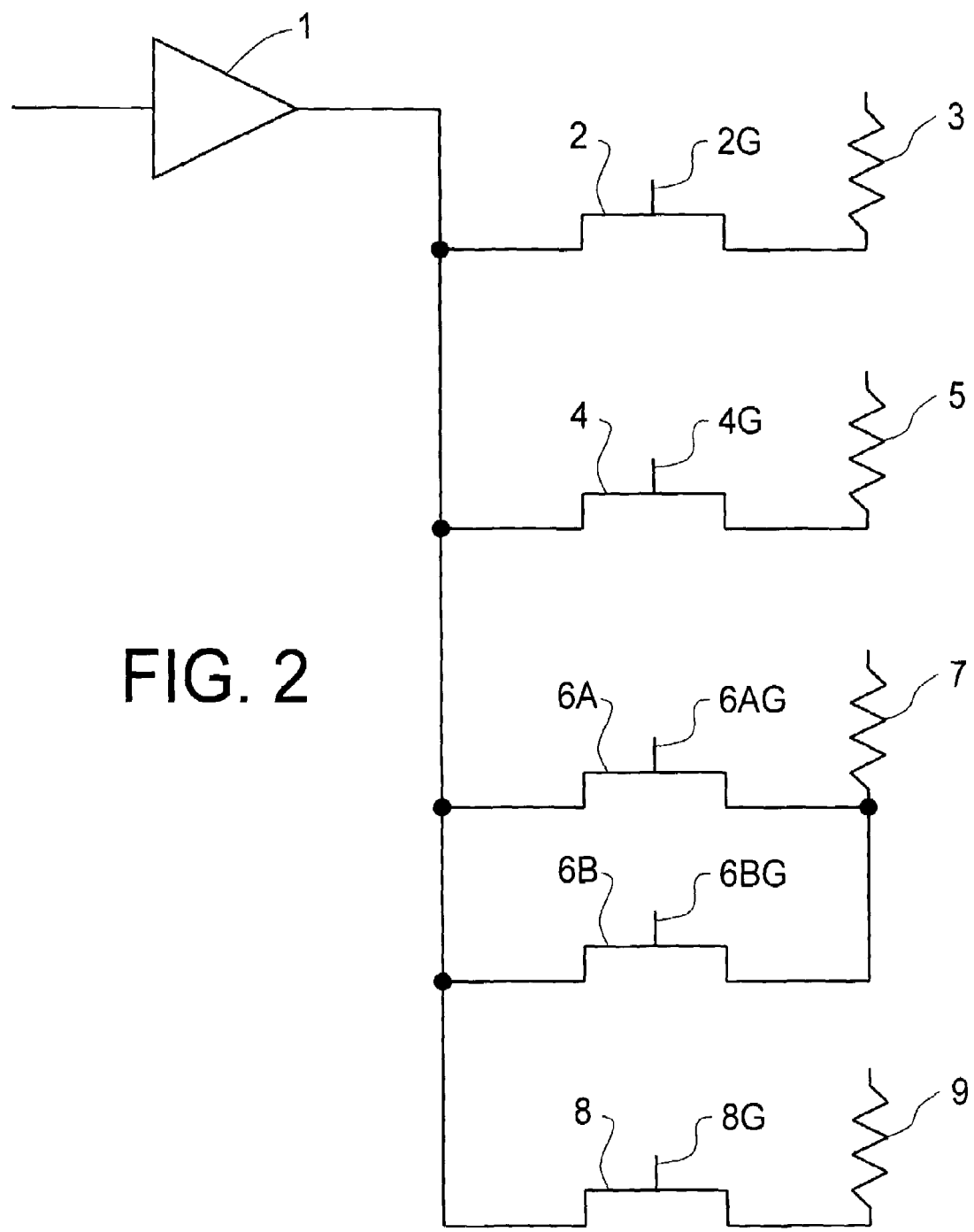
FIG. 2 is a logic diagram of another typical driving node in a second exemplary type.

Referring first to FIG. 1, an exemplary node includes a driver 1 and loads 3, 5, 7, 9 selectively imposed on driver 1 according to the input status of pass transistors 2, 4, 6, 8. The pass transistors are individually enabled by suitable signals applied to their respective gates 2G, 4G, 6G, 8G. Similarly, FIG. 2 shows a second exemplary node in which the load 7 may be imposed on the driver 1 if either or both control transistors 6A, 6B are enabled. The driver nodes shown in FIGS. 1 and 2 are representative of circuits widely found in complex logic, and the transistors are typically input stages to certain types of logic elements such as latches, switches, multiplexers, etc. Often, an individual driver will selectively provide switching current to more than four loads as shown, but this is a sufficient number to explain the invention.

Early in the design of a complex logic circuit (often a module of a larger circuit system such as a processor), a logic equation generation and analysis software tool is used to extract logic equations from a circuit description. For example, the software tool "Circuit" (from Bull Worldwide Information Systems) will perform this function. The logic equations generated by Circuit and equivalent software tools will identify and configure driver nodes along with other logic and will provide a certain amount of analysis such as determining how many loads are driven by a given driving node. However, the "real" loading is not determinable by such tools, and therefore, the worst case is assumed with the resulting drawbacks discussed above.

Figure 3:
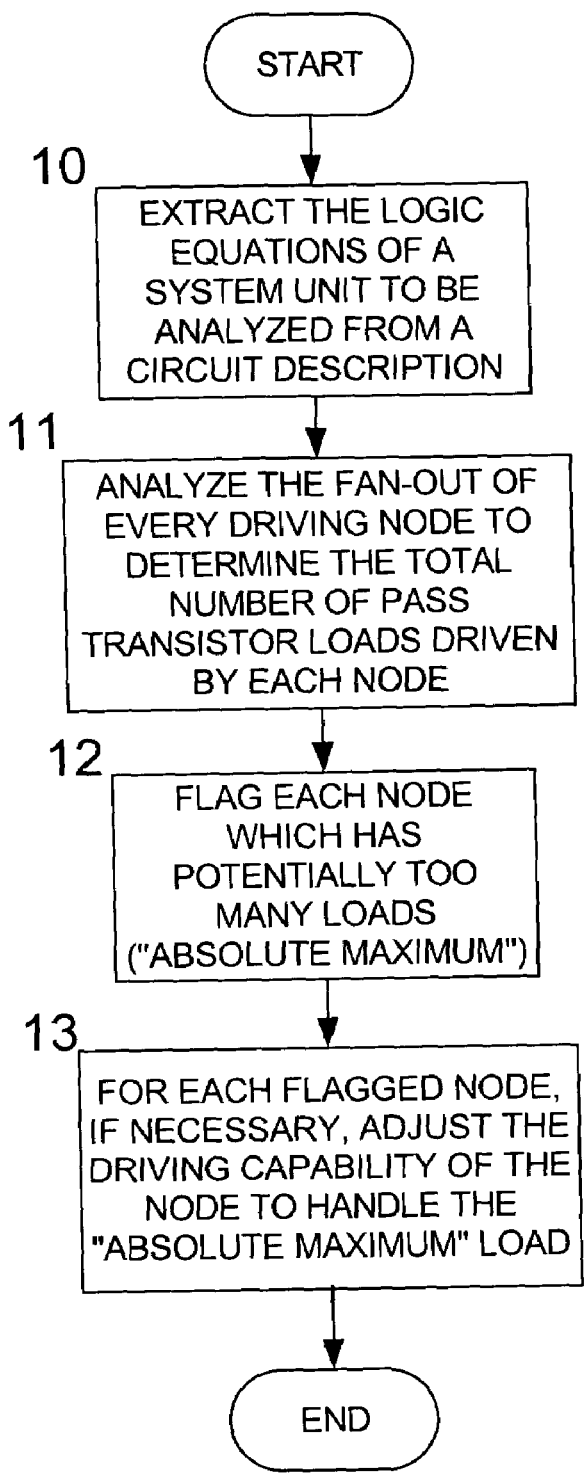
FIG. 3 is a process chart illustrating the manner by which the driving capacity of a given driving node has been established according to the prior art.

Thus, attention is directed to FIG. 3 which is a process flow chart according to the prior art. At step 10, the software tool extracts the logic equations for a given logic circuit from a circuit description. At step 11, the software tool (or another suitable software tool) analyzes the fan-out of every driving node to determine the amount of loading driven by each node, some or all of which may be loading "through" pass transistors. At step 12, the software tool marks each node which has potentially too many loads. That is, a standard driver capable of driving a predetermined number of loads may be assumed for all drivers or for each of a class of drivers. Thus, if a given driver node, such as the driver 1 of the nodes shown in FIGS. 1 and 2, has the capability of driving three loads and there are four potential loads as shown, than that given driver node is marked and identified with an error code. At step 13, the drive handling capacity specification for the given node is adjusted higher such that, when the circuit is implemented in hardware, the worst case condition can be handled.

Figure 4:
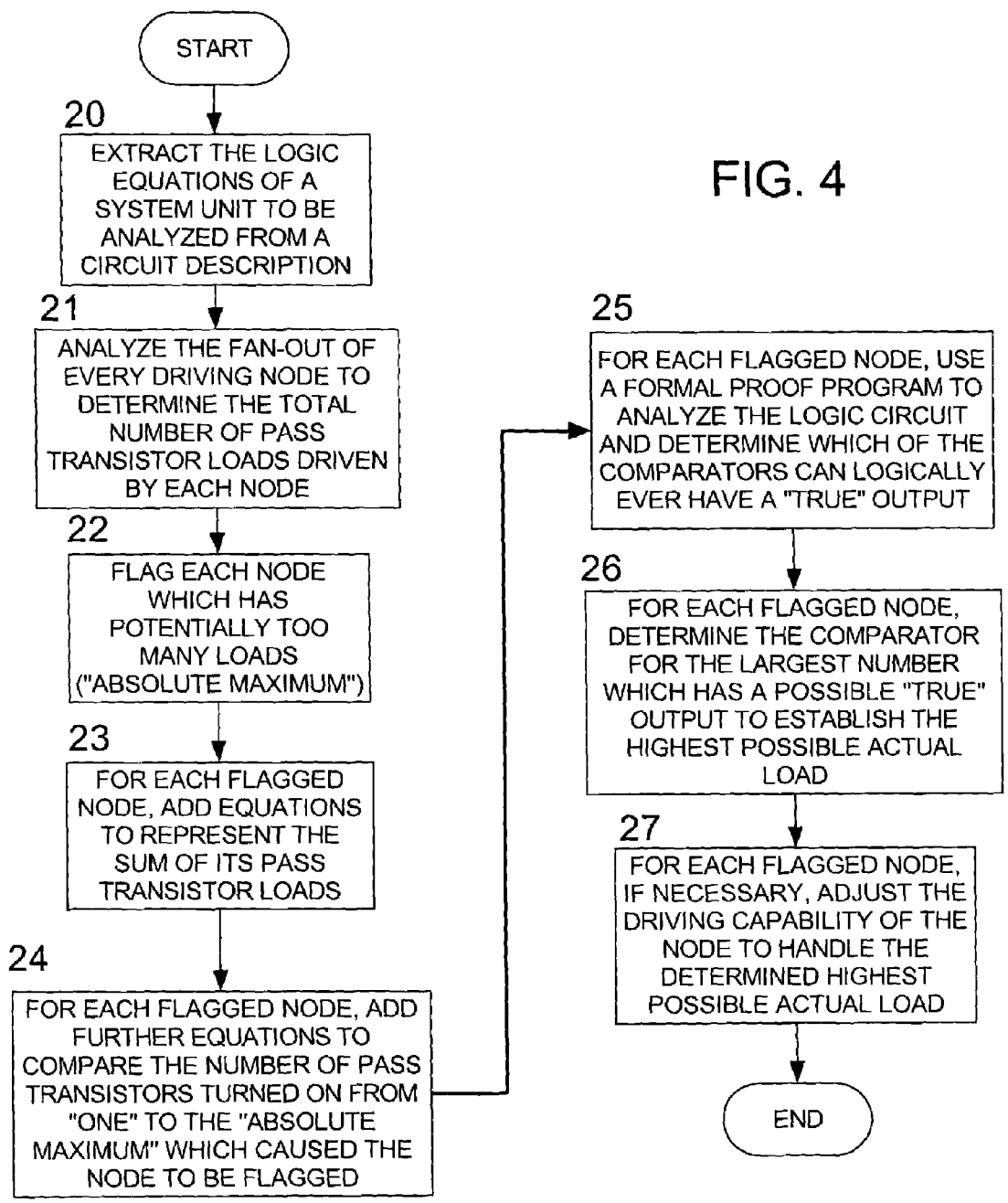
FIG. 4 is a process chart illustrating the manner by which the requirement for driving capacity of a given driving node is established in accordance with the present invention.

Consider now, with reference to FIG. 4, the following discussion of the subject invention which solves the above-discussed problems with the prior art procedure as set forth immediately above with reference to FIG. 3.

First, as in the prior art, use a software tool which extracts the logic equations for a given logic circuit from a circuit description, step 20. Then, also as in the prior art, analyze, at step 21, the fan-out of every driving node to determine the total number of pass transistor loads driven by each node. At step 22, also as in the prior art, flag each node which has potentially too many loads (for an assumed "standard" driver which has a predetermined load driving capacity which is less than "worst case").

Step 23 begins a fundamental departure from the prior art. During step 23, for those nodes identified as having potentially too many loads, equations are added to the circuit's logic description to represent the sum of the loads through all transistors that are "turned on".

At step 24, further equations are added to the circuit's logic description to compare the amount of load seen through the transistors that are "turned on" with each specific number from "one" up to the total (maximum) number of loading transistors. (So if the total number is four as in the example of FIG. 1, there will be four comparisons added to the circuit description, one comparing the number of transistors turned on to "one", a second comparing the number of transistors turned on to "two", and then three, and then four). For loads that are calculated as integral units, this comparison can be an equivalence comparison. For loads that are not integral units, the comparison must be an arithmetic comparison such that each comparator compares the sum of all loads with a number representing the drive capacity of the circuits or transistors available as "drivers".

Thus, after steps 23 and 24, the supplemented logic equations for the exemplary node shown in FIG. 1 would be in the general form:

[original logic equations for the component including the node]

[a loading sum equation representing the sum of loading (unit of loading if transistor one is turned on) .plus. (unit of loading if transistor two is turned on) .plus. (unit of loading if transistor three is turned on) .plus. (unit of loading if transistor four is turned on)]

[a loading comparitive equation comparing the sum of loading with the driving capacity of a unit of one,]

[a second loading comparitive equation comparing the sum of loading with the driving capacity of a unit of two,]

[a third loading comparitive equation comparing the sum of loading with the driving capacity of a unit of three,]

[and a fourth comparitive equation comparing the sum of loading with the driving capacity of a unit of four]

At step 25, a formal proof program is used, for each identified node, to analyze the supplemented logic equations and determine which of the loading comparative equations described in step 24 can have a true output for any signal input combination (for the entire component including a currently analyzed node) in which the currently analyzed node can be active. If the output of the loading comparative equation described in step 24 can never be true, then the condition cannot logically exist and therefore need not be considered with respect to a node's driving capacity requirements. The important consideration is thus which is the largest value of loading which might possibly be seen by the driver, and is represented by largest of the four loading comparitive equations might ever be true.

For the example, assume that the driver 1 of FIG. 1 is preliminarily established as capable of driving three unit loads simultaneously, but it was found in step 22 that there were potentially four loads on driving gate 1. Without this new methodology, the driving capacity of gate 1 would have to be enlarged to provide for a capacity of four. At step 27 however, the process might determine that the highest load to which the driving node might be subjected is only two so it would be found not to be necessary to increase the driving strength of the driver 1 accordingly (in this example, to full "worst case") and indeed the driving capacity could be reduced to a driver for gate 1 capable of driving only two units of loading.

In this manner, the average size of driving nodes in a component can be substantially reduced to achieve the objects set forth above.

Thus, while the principles of the invention have now been made clear in an illustrative embodiment, there will be immediately obvious to those skilled in the art many modifications of structure, arrangements, proportions, the elements, materials, and components, used in the practice of the invention which are particularly adapted for specific environments and operating requirements without departing from those principles.

What is claimed is:

1. A process for determining the optimum load driving capacity for a driving node in a logic circuit comprising the steps of:
   A) extracting the logic equations of the logic circuit from a circuit description thereof;
   B) analyzing the fan-out of the driving node to determine if the total number of pass transistor loads is excessive compared to a predetermined driving capacity;
   C) if, during step B), it is determined that the total number of pass transistor loads is exceeds an absolute maximum, then:
      1) to the logic equations of the logic circuit, adding logic equations which represent the sum of the pass transistor loads;
      2) to the logic equations of the logic circuit, adding comparator logic equations to compare the number of pass transistors turned on from one to the absolute maximum;
      3) using a formal proof program to analyze the logic circuit and determine which of the comparators have a true output;
      4) identifying the comparator for the largest number which has a possible true output to determine the highest possible actual load; and
      5) if necessary, adjusting the driving capacity of the driving node to handle the determined highest possible actual load.

2. A process for determining the optimum load driving capacity for each driving node in a complex logic circuit comprising the steps of:
   A) extracting the logic equations of the logic circuit from a circuit description thereof;
   B) analyzing the fan-out of each driving node to determine if the total number of pass transistor loads of the analyzed node is excessive compared to a predetermined driving capacity;
   C) for each driving node flagged during step B:
      1) to the logic equations of the logic circuit, adding logic equations which represent the sum of the driving node's pass transistor loads; and
      2) to the logic equations of the logic circuit, adding comparator logic equations to compare the number of pass transistors turned on from one to the absolute maximum for the driving node;
   D) using a formal proof program to analyze the logic circuit and determine which of the comparators have a true output;
   E) for each flagged driving node:
      1) identifying the comparator for the largest number which has a possible true output to determine the highest possible actual load for the driving node; and
      2) if necessary, adjusting the driving capacity of the driving node to handle the determined highest possible actual load.

* * * * *